United States Patent
Taura et al.

(12)
(10) Patent No.: US 6,327,180 B2
(45) Date of Patent: *Dec. 4, 2001

(54) SEMICONDUCTOR MEMORY DEVICE FOR EFFECTING ERASING OPERATION IN BLOCK UNIT

(75) Inventors: Tadayuki Taura, Zushi; Shigeru Atsumi, Yokohama, both of (JP)

(73) Assignee: Kabushiki Kaisha Toshiba, Kawasaki (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/532,824

(22) Filed: Mar. 21, 2000

(30) Foreign Application Priority Data

Mar. 23, 1999 (JP) .................................................. 11-077432

(51) Int. Cl.[7] ................................................ G11C 16/06
(52) U.S. Cl. ............................... 365/185.09; 365/230.06; 365/185.11; 365/200
(58) Field of Search ...................... 365/230.06, 230.03, 365/185.11, 200, 185.09

(56) References Cited

U.S. PATENT DOCUMENTS

| 5,307,316 | * | 4/1994 | Takemae | ................ 365/200 |
|---|---|---|---|---|
| 5,381,370 | * | 1/1995 | Lacey et al. | ........................... 365/200 |
| 5,561,627 | * | 10/1996 | Matsubara et al. | ......... 365/185.09 X |
| 5,619,469 |  | 4/1997 | Joo | ..................................... 365/225.7 |
| 5,689,463 |  | 11/1997 | Murakami et al. | . |
| 5,774,396 | * | 6/1998 | Lee et al. | ........................ 365/185.09 |

FOREIGN PATENT DOCUMENTS

| 0 537 973 A2 | 10/1991 | (EP) . |
| 0 590 809 A2 | 6/1993 | (EP) . |
| WO 96/34391 | 10/1996 | (WO) . |

OTHER PUBLICATIONS

European Search Report dated Sep. 6, 2000.

* cited by examiner

Primary Examiner—Huan Hoang
(74) Attorney, Agent, or Firm—Banner & Witcoff, Ltd.

(57) ABSTRACT

A semiconductor memory device includes a plurality of block cores which are each treated as one unit at the erase time, an R/D block core which is used instead of a memory cell array of a cor6responding one of the block cores in which a defect occurs, an R/D address storing section for storing an address of a defective block, and an R/D address comparing section for comparing an output signal of the R/D address storing section with an output signal of a block address buffer. If the result of comparison in the R/D address comparing section indicates "coincidence", a block decoder in the R/D block core is set into a selected state and a block decoder in the defective block core is forcedly set into a non-selected state to replace the defective block core by the R/D block core.

19 Claims, 11 Drawing Sheets

SEMICONDUCTOR MEMORY DEVICE FOR EFFECTING ERASING OPERATION IN BLOCK UNIT

CROSS-REFERENCE TO RELATED APPLICATIONS

This application is based upon and claims the benefit of priority from the prior Japanese Patent Application No. 11-077432, filed Mar. 23, 1999, the entire contents of which are incorporated herein by reference.

BACKGROUND OF THE INVENTION

This invention relates to a semiconductor memory device using MOS transistors of stacked gate structures as memory cells and capable of rewriting/reading out data and more particularly to the technique for replacing a defective cell by a redundancy cell when the defect occurs in a semiconductor memory device for effecting the erasing operation in the block unit.

A memory cell of an EEPROM for electrically erasing/programming data is generally constructed by a MOS transistor (nonvolatile transistor) of stacked gate structure using two-layered polysilicon layers which are isolated from each other by an insulating film as shown in FIG. 1. This type of memory cell is disclosed in, for example, IEEE JOURNAL OF SOLID-STATE CIRCUITS, Vol. 27 No. 11 November 1992 pp. 1540–1545.

In the above memory cell, a floating gate 11 is formed of a first-level polysilicon layer and a control gate is formed of a second-level polysilicon layer. A source region 14 and drain region 15 are separately formed in a silicon substrate 13 which lies below the floating gate 11 and control gate 12. An inter-level insulating film 16 is formed on the entire portion of the main surface of the substrate 13 and a contact hole 17 is formed in that portion of the inter-level insulating film 16 which lies on the drain region 15. A data line (bit line) 18 formed of metal such as aluminum is formed on the inter-level insulating film 16 and in the contact hole 17 and electrically connected with the drain region 15.

Next, the data programming, reading and erasing operations in the memory cell of the above structure is explained.

The programming operation is effected by, for example, respectively setting the drain potential VD, control gate potential VCG and source potential VS at 5.0V, 9.0V and 0V and injecting hot electrons into the floating gate 11 to change the threshold voltage.

The erasing operation is effected by, for example, setting the control gate potential VCG at −7.0V, setting the drain into the electrically floating state and setting the source potential VS at 5.0V, for example. In this state, electrons in the floating gate 11 are withdrawn into the source region 14 by the tunnel effect.

The reading operation is effected by, for example, respectively setting the control gate potential VCG, drain potential VD and source potential VS at 4.8V, 0.6V and 0V. At this time, if the memory cell is set in the programmed state, no current flows between the source and drain. Memory data at this time is set as "0". If the memory cell is set in the erased state, a current of approx. 30 $\mu$A flows between the source and drain. Memory data at this time is set as "1".

In the memory cell with the above structure, various defects will occur in the manufacturing process due to the lattice defect in the silicon substrate 13 and the defect of the insulating film. For example, it is considered that the silicon substrate 13 will be short-circuited to the floating gate 11 or control gate 12. In this case, it becomes impossible to effect the correct programming, erasing and reading operations. This problem becomes more serious with an increase in the memory capacity of the semiconductor memory device, and particularly, it is important at the starting time of the manufacturing line for performing the fine patterning process.

In order to solve the above problem, various types of redundancy circuits are generally provided in the semiconductor memory device. The redundancy technology is disclosed in, for example, Japanese Patent Application KOKAI Publication No. 11-213691.

FIG. 2 is a block diagram showing the schematic construction of a nonvolatile semiconductor memory device using MOS transistors with the above stacked gate structures as memory cells and having redundancy cells which will be used instead of defective cells. The semiconductor memory device includes a column address buffer 20, column decoder 21, row address buffer 22, R/D (redundancy) address storing section 23, R/D address comparing section 24, block address buffer 25, block cores 26-0 to 26-n, sense amplifier (S/A) 27, input/output buffer 28 and input/output pad 29. Each of the block cores 26-0 to 26-n includes a memory cell array 30, row decoder 31, R/D memory cell array 32, R/D row decoder 33, block decoder 34 and column selection gates CT0 to CTj.

In the memory cell array 30, memory cells having the same structure as shown in FIG. 1 are arranged in a matrix form. The drains of the memory cells on each column are commonly connected to a corresponding one of bit lines BL0 to BLj and the control gates of the memory cells on each row are commonly connected to a corresponding one of word lines WL0 to WLk.

A row address signal ADDRi is input from the exterior to the row address buffer 22 and an output signal ARSi thereof is supplied to the row decoders 31 of the block cores 26-0 to 26-n as an internal row address signal. One of the word lines WL0 to WLk is selected by the row decoder 31. A column address signal ADDCi is input from the exterior to the column address buffer 20. An output signal ACSi of the column address buffer 20 is supplied to and decoded by the column decoder 21 as an internal column address signal and then supplied to the column selection gates CT0 to CTj of each of the block cores 26-0 to 26-n. One of the bit lines BL0 to BLj is selected by the column selection gates CT0 to CTj and one memory cell connected to the selected bit line and selected word line is selected.

Stored data of the selected memory cell is supplied to the sense amplifier 27 via the selected column selection gate, amplified and then output to the exterior from the input/output pad 29 via the input/output buffer 28.

Next, a case wherein a memory cell in the memory cell array 30 is defective is considered. In the R/D memory cell array 32 used for replacement of the defective cell, a plurality of memory cells are arranged in a matrix form like the memory cell array 30. In the present device, addresses of the defective portions are previously stored in the R/D address storing section 23. An output signal AFi of the R/D address storing section 23 is compared with an output signal ARSi of the row address buffer 22 in the R/D address comparing section 24. If the result of comparison indicates coincidence of the output signals, a signal HITR is output from the R/D comparing section 24 and supplied to the R/D row decoders 33 of the block cores 26-0 to 26-n. Then, one of the R/D row decoders 33 which corresponds to the memory cell array 30 containing the defective cell is set into the enable state to select one of word lines WLRD-0 to WLRD-I. At this time, one of the row decoders 31 which corresponds to the memory cell array 30 containing the defective cell is forcedly set into the non-selected state by a signal ROWDIS output from the R/D address comparing section 24. The sources of all of the memory cells in the memory cell array 30 and R/D memory cell array 32 are connected to a corresponding one of common source lines SLi (i=0 to n), an output signal of the block decoder 34 is commonly supplied thereto and the erase operation is simultaneously effected at the erasing time (block erasing).

Generally, a plurality of erasing cores (corresponding to the block cores 26-0 to 26-n in FIG. 2) are present in one semiconductor memory device. Next, the erase operation of the present device is explained in detail. A source potential 5.0V is applied from the common source lines SLi (i=0 to n) to the source lines of the memory cells in the memory cell array 30 and R/D memory cell array 32 in each of the block cores 26-0 top 26-n. A potential of −7.0V is applied from the row decoder 31 and R/D row decoder 33 to the word lines WL0 to WLk and WLRD-0 to WLRD-I. However, 0V is applied to the defective row of the memory cell array 30 and the unused R/D row of the R/D memory cell array 32. At this time, the substrate potential of all of the memory cells is set at 0V so as to prevent application of stress to the defective cell.

Recently, however, with an increase in the integration density of the semiconductor memory device, the structure itself of the memory cell shown in FIG. 1 becomes a serious problem. That is, since it is extremely important that a variation in the threshold voltage of the memory cell after the erase operation is suppressed to minimum in the erase operation, the source region 14 is relatively deeply formed in the memory cell shown in FIG. 1. At this time, the degree (Xj) of entry of impurity into under the gate becomes large to reduce the effective gate length (Leff). Therefore, it is necessary to determine the control gate length by taking the above fact into consideration and it is necessary to previously set the control gate 12 longer. This is a factor for preventing a reduction in the cell area.

By taking the above fact into consideration, a memory cell of the structure shown in FIG. 3 which is disclosed in, for example, IEEE JOURNAL OF SOLID-STATE CIRCUITS, Vol. 27 No. 11 November 1992 pp. 1547–1553 is proposed. In FIG. 3, portions which correspond to those of FIG. 1 are denoted by the same reference numerals. The memory cell is formed in a P-well region 35 formed in the silicon substrate 13. The P-well region 35 is formed in an element isolating N-well region 36.

The programming and reading operations of the memory cell with the above structure are the same as those of the memory cell shown in FIG. 1. In the programming and reading operations, 0V is applied to the N-well region 36 and P-well region 35. The erase operation is effected as follows. That is, for example, the floating gate potential VCG is set at −7.5V, the drain is set in the electrically floating state and 10V is applied to the P-well region 35 and N-well region 36, for example. At this time, the source potential VS is set at 10V (or the source may be set in the electrically floating state). Thus, electrons in the. floating gate 11 are withdrawn into the P-well region 35 by the tunnel effect. At this time, since the erasing process is effected in the facing surfaces of the floating gate 11 and P-well region 35, it is not necessary to form the source region 14 deep and the degree (Xj) of entry of impurity into under the gate can be suppressed. As a result, the cell area can be easily reduced.

Next, a case wherein the memory cell with the above structure is applied to the semiconductor memory device shown in FIG. 2 is considered. At this time, it is assumed that the P-well region 35 and N-well region 36 are commonly connected to the source of each memory cell via the common source line SLi. As described before, in the erase operation, 0V is applied to the defective row and unused R/D row. However, at this time, 10V is applied as the P-well potential which is the substrate potential of the memory cell. For example, if the control gate 12 is short-circuited to the substrate (P-well region 35), the potential of the P-well region 35 is short-circuited via the row decoder 31 and it becomes impossible to apply a correct P-well potential. As a result, there occurs a possibility that the erase operation cannot be effected for the block or the erase operation cannot be effected within a preset period of time.

As described above, in the conventional semiconductor memory device, a problem that it is difficult to reduce the memory cell area occurs although it is possible to replace the defective memory cell in the row unit if the memory cell of the structure in which the high potential is applied to the source to withdraw electrons in the floating gate into the source is used. If the memory cell of the structure in which the high potential is applied to the P-well region used as the substrate to withdraw electrons in the floating gate into the P-well region is used in order to solve the above problem, it becomes easy to reduce the cell area, but there occurs problem that the potential of the P-well region cannot be correctly applied and the erase operation cannot be effected when replacement of the memory cells in the row unit is made.

BRIEF SUMMARY OF THE INVENTION

Accordingly, an object of this invention is to provide a semiconductor memory device in which electrons in the floating gate are withdrawn into the substrate (P-well region) in the erasing process of the memory cell and which can stably replace a defective cell even if the defective cell is contained in the memory cells.

Further, another object of this invention is to provide a semiconductor memory device which can suppress the voltage drop due to the presence of the defective portion and will not obstruct the erase operation for correct block cores.

Another object of this invention is to provide a semiconductor memory device in which the reading operation can be effected with the control gate potential set at the power supply voltage and it is not necessary to control the control gate potential and which can make the operation margin of the low-voltage operated device large.

The above objects can be attained by a semiconductor memory device which comprises a plurality of first memory blocks each having memory cells arranged in a matrix form; first decoders for respectively selecting the first memory blocks; at least one second memory block of substantially the same construction as the first memory blocks; a second decoder for selecting the second memory block; a block address buffer for outputting block address information; a defective block address storing section for storing a defective block address; and a defective block address comparing section for comparing the defective block address stored in the defective block address storing section with a block address input from the block address buffer; wherein one of the first decoders which selects the first memory block in which a defective cell occurs is set into the non-selected state and the second decoder is set into the selected state when coincidence of the compared addresses is detected in the defective block address comparing section.

With the above construction, since the block core is treated as one unit for replacement, the defective memory cell can be replaced without fail even if the defective cell is contained in the memory cells when the memory cell of the structure in which a high potential is applied to the P-well region used as the substrate to withdraw electrons in the floating gate into the P-well region is used.

When all of the blocks of the semiconductor memory device are simultaneously subjected to the erase operation, the voltage dorp due to the presence of the defective portion can be suppressed by preventing a voltage from being applied to the block core containing the defect and the erase operation for the correct block core will not be obstructed.

Further, since the memory cell of the structure which is the same as the memory cell of the main body is used as a memory element of the fail address and the threshold voltage of the memory cell at the erasing time is lowered (for erasing) to a ground level or less, the reading operation can be effected with the control gate potential set at the power supply voltage, it is not necessary to control the control gate potential and the operation margin of the low-voltage operated device can be made large.

Further, the objects of this invention can be attained by a semiconductor memory device in which electrons in a floating gate are withdrawn into a well region at the erasing time of memory cells and which comprises a plurality of block cores each including a memory cell array having memory cells arranged in a matrix form, a row decoder for selecting a row of the memory cells of the memory cell array, a block decoder for selecting the block, a disable latch for forcedly inhibiting the selecting operation, and column selection gates for respectively selecting columns of the memory cells of the memory cell array; at least one relieving block core of substantially the same structure as the plurality of block cores; a row address buffer supplied with a row address signal, for supplying an internal row address signal to the row decoders in the plurality of block cores and relieving block core; a column address buffer supplied with a column address signal; a column decoder for decoding an internal column address signal output from the column address buffer, for selecting the column selection gates of the plurality of block cores and relieving block core; a block address buffer supplied with a block address, for outputting a block selection signal to the block decoders of the plurality of block cores; a relieving address storing section for storing an address of the block core in which a defect occurs; an address comparing section for comparing the address of the block core stored in the address storing section with a block selection signal output from the block address buffer; a disable pulse generating section for outputting a pulse signal; a sense amplifier for amplifying data read out from the selected memory cell; and an input/output buffer for transferring data with respect to the sense amplifier; wherein an address of a block core is stored in the address storing section when a defect occurs in the memory cell array of the above block core, a disable signal is output from the address comparing section when coincidence is detected by the address comparing section, and the block decoder in the block core in which the defect occurs is forcedly set into the non-selected state and the block decoder in the relieving block core is set into the selected state to replace the block core in which the defect occurs by the relieving block core.

With the above construction, since the defect relieving operation is effected with the block core treated as one unit, the defective memory cell can be replaced without fail even if the defective cell is contained in the memory cells when the memory cell of the structure in which a high potential is applied to the P-well region used as the substrate to withdraw electrons in the floating gate into the P-well region is used.

When all of the blocks of the semiconductor memory device are simultaneously subjected to the erase operation, the voltage drop due to the presence of the defective portion can be suppressed by preventing a voltage from being applied to the block core containing the defect and the erase operation for the correct block core will not be obstructed.

Further, since the memory cell of the structure which is the same as the memory cell of the main body is used as a memory element of the fail address and the threshold voltage of the memory cell at the erasing time is lowered (for erasing) to a ground level or less, the reading operation can be effected with the control gate potential set at the power supply voltage, it is not necessary to control the control gate potential and the operation margin of the low-voltage operated device can be made large.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 4:
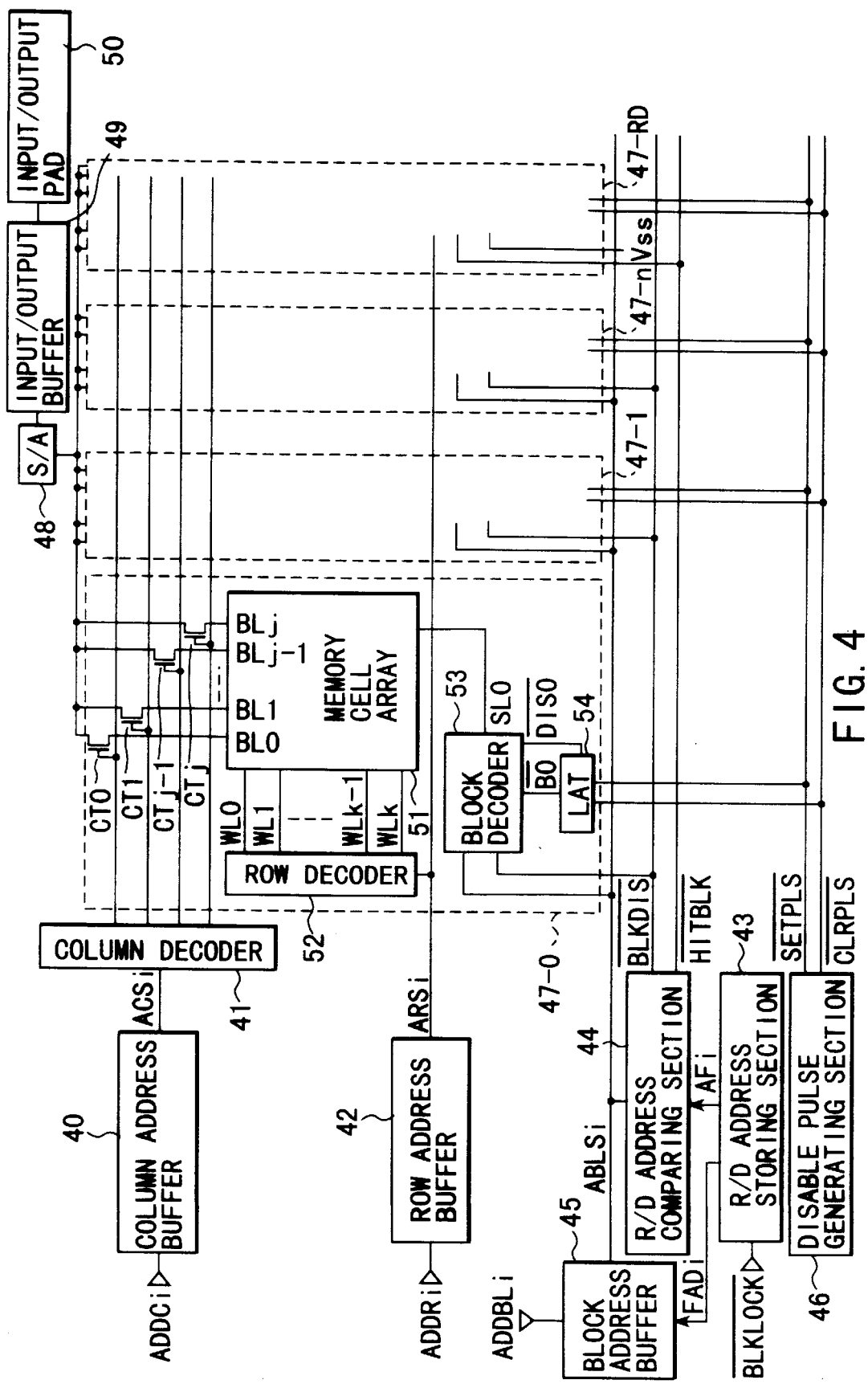
FIG. 4 is a block diagram showing the main portion of a semiconductor memory device according to an embodiment of this invention.

FIG. 4 is a block diagram showing the main portion of a semiconductor memory device according to an embodiment of this invention. The semiconductor memory device includes a column address buffer 40, column decoder 41, row address buffer 42, R/D (redundancy) address storing section 43, R/D address comparing section 44, block address buffer 45, disable pulse generating section 46, block cores 47-0 to 47-n, R/D block core 47-RD, sense amplifier (S/A) 48, input/output buffer 49 and input/output pad 50. Each of the block cores 47-0 to 47-n and R/D block core 47-RD includes a memory cell array 51, row decoder 52, block decoder 53, disable latch (LAT) 54 and column selection gates CT0 to CTj.

Figure 1:
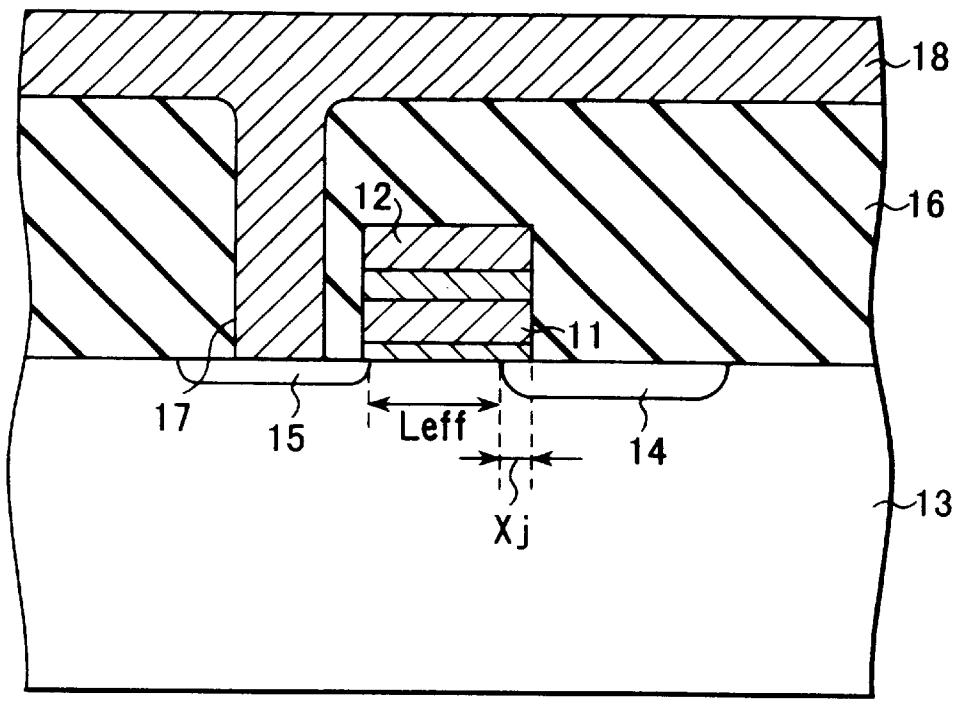
FIG. 1 a cross sectional view of a conventional memory cell an EEPROM which electrically effects the data erasing/reprogramming operation.
Figure 3:
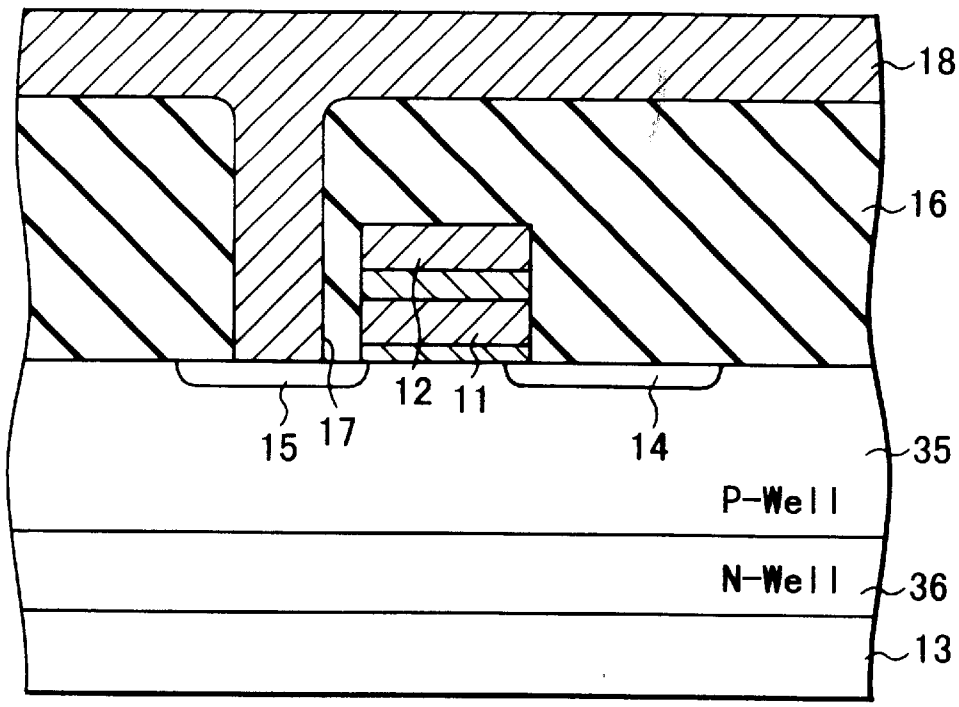
FIG. 3 is a cross sectional view of an improved memory cell in an EEPROM which electrically effects the data erasing/reprogramming operation.

The memory cell arrays 51 of the block cores 47-0 to 47-n and R/D block core 47-RD are respectively formed in independent P-well regions which are formed in an N-well region. In each memory cell array 51, memory cells formed of nonvolatile transistors shown in FIG. 3 are arranged in a matrix form. The drains of the memory cells on each column are commonly connected to a corresponding one of bit lines BL0 to BLj for each of the block cores 47-0 to 47-n and R/D block core 47-RD and the control gates of the memory cells on each row are commonly connected to a corresponding one of word lines WL0 to WLk.

Figure 2:
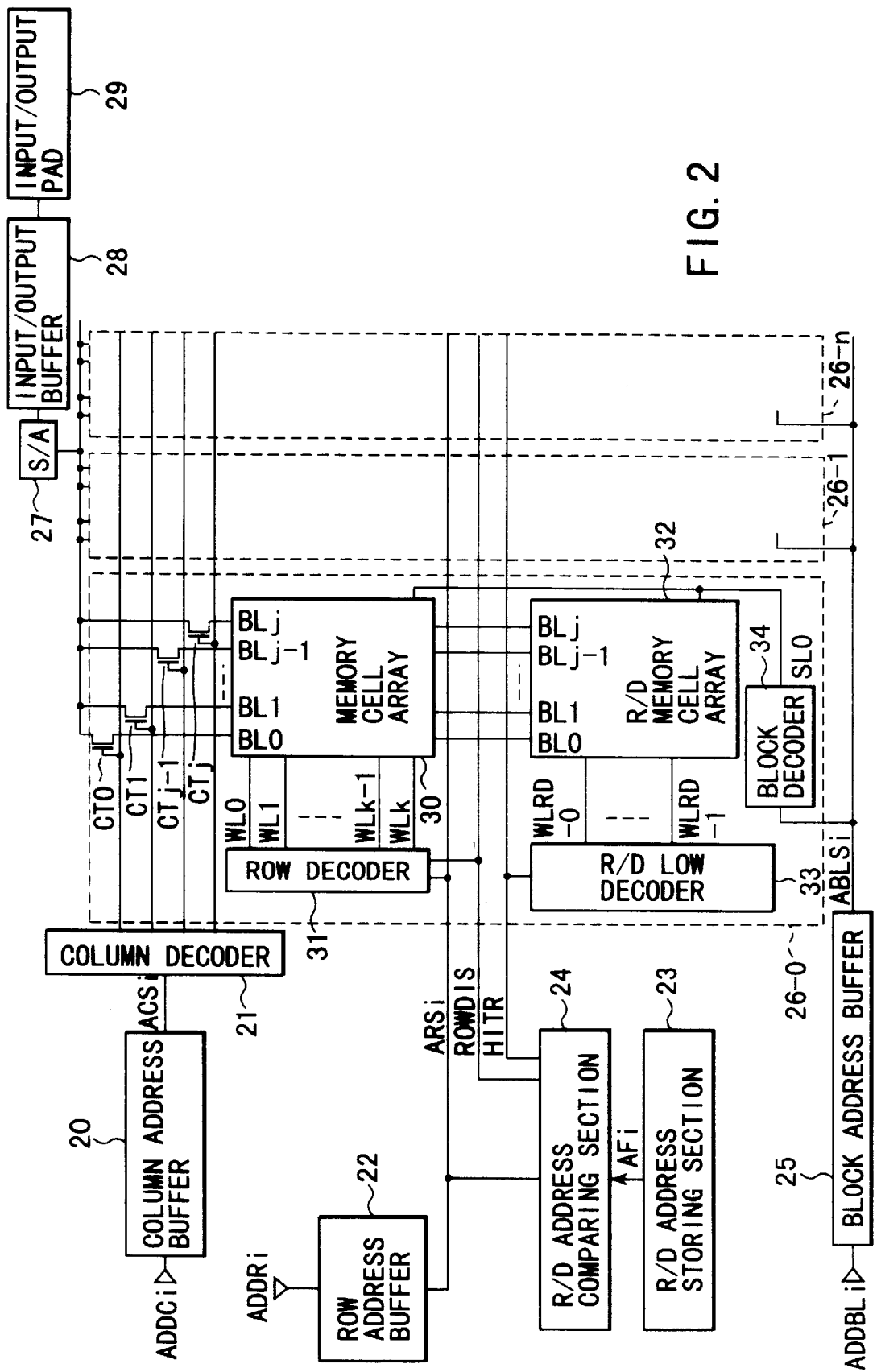
FIG. 2 is a block diagram showing the schematic construction of a conventional semiconductor memory device which uses MOS transistors of stacked gate structures as memory cells and in which redundancy cells each used for replacement of a defective cell when the defective cell is present are provided.

That is, in the semiconductor memory device of this embodiment, the R/D memory cell array 32 and R/D decoder 33 provided in each of the block cores 26-0 to 26-n in the conventional semiconductor memory device shown in FIG. 2 for replacement in the row unit are omitted. Instead of them, the R/D block core 47-RD used for replacement in the block core unit and having the same structure as the block cores 47-0 to 47-n which are selected in the normal state is provided. Each of the block cores 47-0 to 47-n and R/D block core 47-RD has the disable latch (LAT) 54 for forcedly inhibiting the selecting operation of the block decoder. The disable latch 54 is supplied with a block selection signal /Bi (i=0 to n, RD) output from the block decoder 53 and latches a latch signal /DISi (i=0 to n, RD) in response to a signal /SETPLS output from the disable pulse generating section 46 to forcedly set the block decoder 53 into a non-selected state.

With the above construction, the row address buffer 42 is supplied with a row address signal ADDRi from the exterior and an output signal ARSi thereof is supplied as an internal row address signal to the row decoders 52 in the block cores 47-0 to 47-n and R/D block core 47-RD. The row decoder 52 selects one of the word lines WL0 to WLk in the memory cell array 51. The column address buffer 40 is supplied with a column address signal ADDCi from the exterior and an output signal ACSi thereof is supplied as an internal column address signal to the column decoder 41 and decoded. One of the column selection gates CT0 to CTj in each of the block cores 47-0 to 47-n and R/D block core 47-RD is selected by the output signal of the column decoder 41 so as to select one of the bit lines BL0 to BLj. The block address buffer 45 is supplied with a block address signal ADDBLi and an output signal ABLSi thereof is supplied to the block decoders 53 of the block cores 47-0 to 47-n and R/D block core 47-RD. Thus, one memory cell connected to the selected bit line and selected word line in the memory cell array of the selected block core is selected. Stored data in the selected memory cell is supplied to the sense amplifier 48 via the column selection gate of the selected block core, amplified, then supplied to the input/output buffer 49 and output to the exterior from the input/output pad 50.

Next, a case wherein a defect occurs in the memory cell array 51 in the semiconductor memory device of this embodiment is considered. In the present device, if the memory cell array 51 has a defect, the address of the block core containing the defect is previously stored in the R/D address storing section 43 and an output signal AFi of the R/D address storing section 43 and an output signal ABLSi of the block address buffer 45 are compared in the R/D address comparing section 44. If the result of comparison indicates "coincidence", a signal /HITBLK is output from the R/D address comparing section 44. At this time, the block decoder 53 of the block core 47-RD is set into the selected state. At the same time, a signal /BLKDIS is output from the R/D address comparing section 44 and supplied to the block decoder 53 for normal selection in the block core containing the defect to forcedly set the block decoder 53 into the non-selected state. Thus, the block core containing the defect is replaced by the R/D block core 47-RD for redundancy. In this case, the signal /BLKDIS is not input to a corresponding input portion of the R/D block core 47-RD (for example, the power supply voltage=VDD is input). In the memory cell array 51 of the redundancy block core 47-RD, the erase operation can be correctly effected even if the nonvolatile transistors of the structure shown in FIG. 3 are used as the memory cells unless a defect such as the short circuit between the substrate (P-well region) and the floating gate or control gate occurs.

With the above semiconductor memory device, the erase operation can be generally effected in the block core unit. However, if a reduction in the test time is taken into consideration, it is desirable to simultaneously subject a plurality of blocks to the erase operation. For this purpose, a mode in which a plurality of blocks are forcedly set into the selected state is additionally provided as a test mode. In this case, the block core containing the defect will also be forcedly selected. As a result, there occurs a possibility that the correct substrate potential SLi cannot be applied to all of the blocks because of a leak current flowing via the defective cell and the erase operation for all of the blocks cannot be effected. In this embodiment, this fact is also taken into consideration, and if a test signal /BLKLOCK falls, fail address data (signal FADi) stored in the R/D address storing section 43 is input to the block address buffer 45 to set the block decoder 53 in the defective block core into the selected state. At this time, a signal /SETPLS is output from the disable pulse generating section 46 and latched into the disable latch 54 of the block. If the signal is latched into the disable latch 54, the block decoder 53 of the block is forcedly set into the non-selected state to prevent a potential from being applied to the defective block in the simultaneous erase operation for all of the blocks and a lowering in the potential can be prevented. Therefore, the simultaneous erase operation for all of the blocks can be effected.

Figure 5:
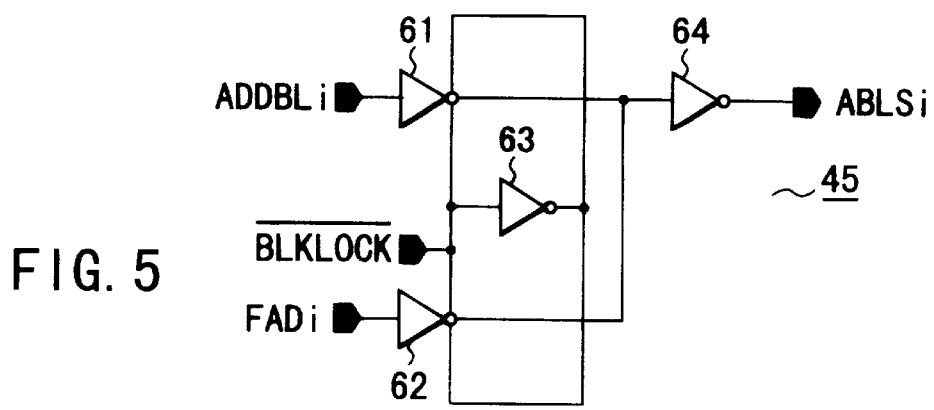
FIG. 5 is a circuit diagram showing an example of the detail construction of a block address buffer in the circuit shown in FIG. 4.

FIG. 5 is a circuit diagram showing an example of the detail construction of the block address buffer 45 in the circuit shown in FIG. 4. The buffer 45 includes clocked inverters 61, 62 and inverters 63, 64. The block address signal ADDBLi and the signal FADi (fail address data) from the R/D address storing section 43 are respectively supplied to the input terminals of the clocked inverters 61, 62. One-side clock input terminals of the clocked inverters 61, 62 are supplied with a test signal /BLKLOCK and the other clock input terminals thereof are supplied with a signal obtained by inverting the test signal /BLKLOCK by the inverter 63. The output signals of the clocked inverters 61, 62 are supplied to the input terminal of the inverter 64 which in turn outputs an output signal ABLSi.

The test signal /BLKLOCK is generally set at the "H" level, and at this time, the block address signal ADDBLi is transferred via the clocked inverter 61 and inverter 64 and output as the output signal ABLSi. At the test time, the test signal /BLKLOCK is set at the "L" level, and at this time, the signal FADi indicating the fail address data is transferred via the clocked inverter 62 and inverter 64 and output as the output signal ABLSi. The output signal ABLSi of the block address buffer 45 is supplied to the block decoders 53 in the block cores 47-0 to 47-n and R/D block core 47-RD.

Figure 6:
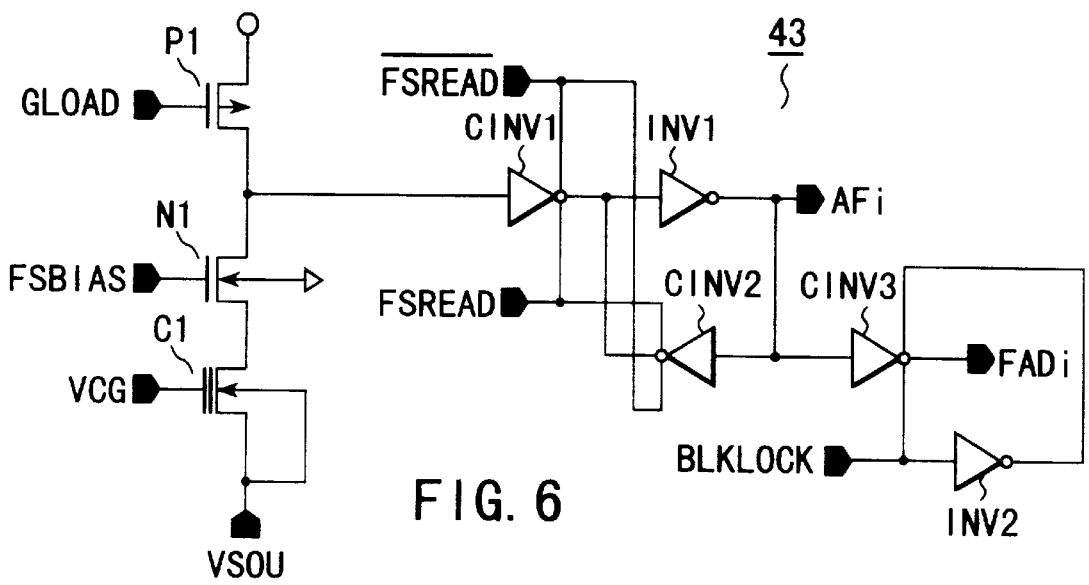
FIG. 6 is a circuit diagram showing an example of the construction of part of an R/D address storing section in the circuit shown in FIG. 4 with the memory cell used as a fuse cell.

FIG. 6 is a circuit diagram showing an example of the construction of part of the R/D address storing section 43 in the circuit shown in FIG. 4 with the memory cell used as a fuse cell. The circuit includes a memory cell transistor C1, P-channel MOS (PMOS) transistor P1, N-channel MOS (NMOS) transistor N1 having a threshold voltage of approx. 0V, clocked inverters CINV1, CINV2, CINV3 and inverters INV1, INV2. The memory transistor (which is hereinafter referred to as a fuse cell) C1 is a transistor having the same structure as the main body (memory cells of each memory cell array 51) and used for storing address information. If an address "0" is stored, the threshold voltage of the fuse cell C1 is erased or lowered to a ground (GND) level or less. If "1" is stored, it is programmed to a positive level which is higher than the power supply voltage VDD (for example, Vth=5.0V). The PMOS transistor P1 is used as a load when information of the fuse cell C1 is read out and is formed with such a size as to cause a minute current (for example, 1 µA) to flow in response to a gate signal GLOAD. At this time, the gate signal GLOAD may be set at a 0V level or an intermediate potential for causing the minute current to flow. The NMOS transistor N1 whose gate is supplied with a signal FSBIAS has a function of limiting the drain potential of the fuse cell C1. As the level of the signal FSBIAS, a potential higher than the drain potential by a threshold voltage VthN of the NMOS transistor N1 is used.

The two clocked inverters CINV1, CINV2 and inverter INV1 constitute a latch circuit for holding stored information of the fuse cell C1. The latch operation of the latch circuit is effected at the time of turn-ON of the power supply. The reason is to prevent delay in access due to the readout of the fuse cell C1. At the time of turn-ON of the power supply, the signal GLOAD and signal FSBIAS are set at the potentials at the readout time as described before. The control gate VCG of the fuse cell C1 is set at the power supply voltage at the time of turn-ON of the power supply, for example, 1V. The signal VSOU which is used as the source potential and well potential is also set at 0V. At this time, a signal FSREAD is set at the "H" level and a signal /FSREAD is an inverted signal thereof. Thus, if a "0" address is stored in the fuse cell, a current flows since the threshold voltage is lowered (for erasing) to a negative value and "0" is output as the signal AFi. If a "1" address is stored in the fuse cell, no current flows since the threshold voltage is programmed to a positive value and "1" is output as the signal AFi. After the end of the readout operation, the signal FSREAD is set to the "L" level and information of the fuse cell is latched. At this time, since the control gate VCG of the fuse cell C1 at the readout time is set at the power supply voltage level, it is not necessary to control the control gate potential even if the readout operation is effected in a state in which the power supply voltage is set at the low level and it becomes particularly effective for the low-voltage operated device.

Figure 7:
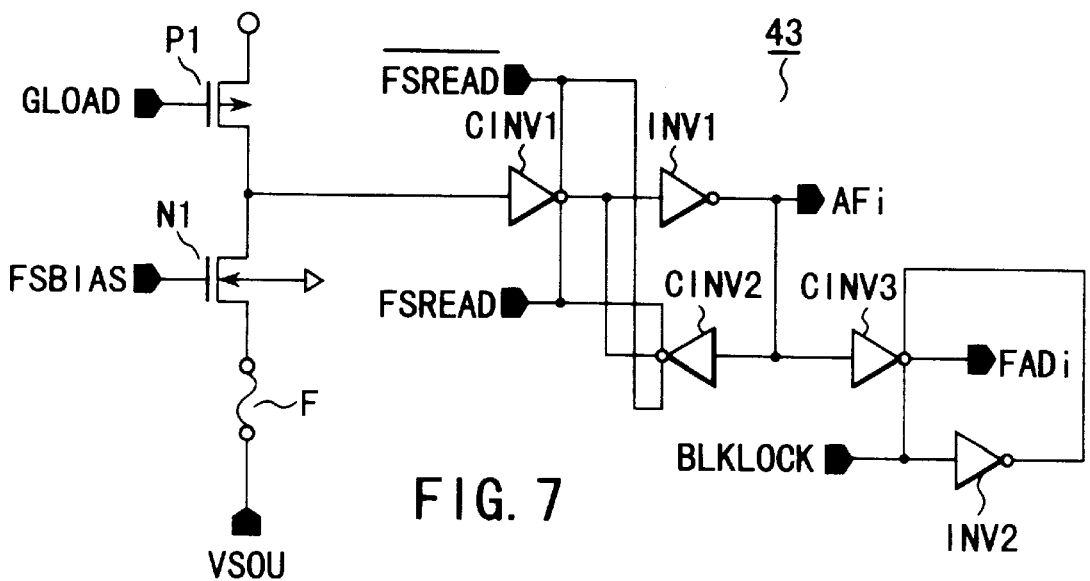
FIG. 7 is a circuit diagram showing another example of the construction of the R/D address storing section in the circuit shown in FIG. 4.
Figure 8:
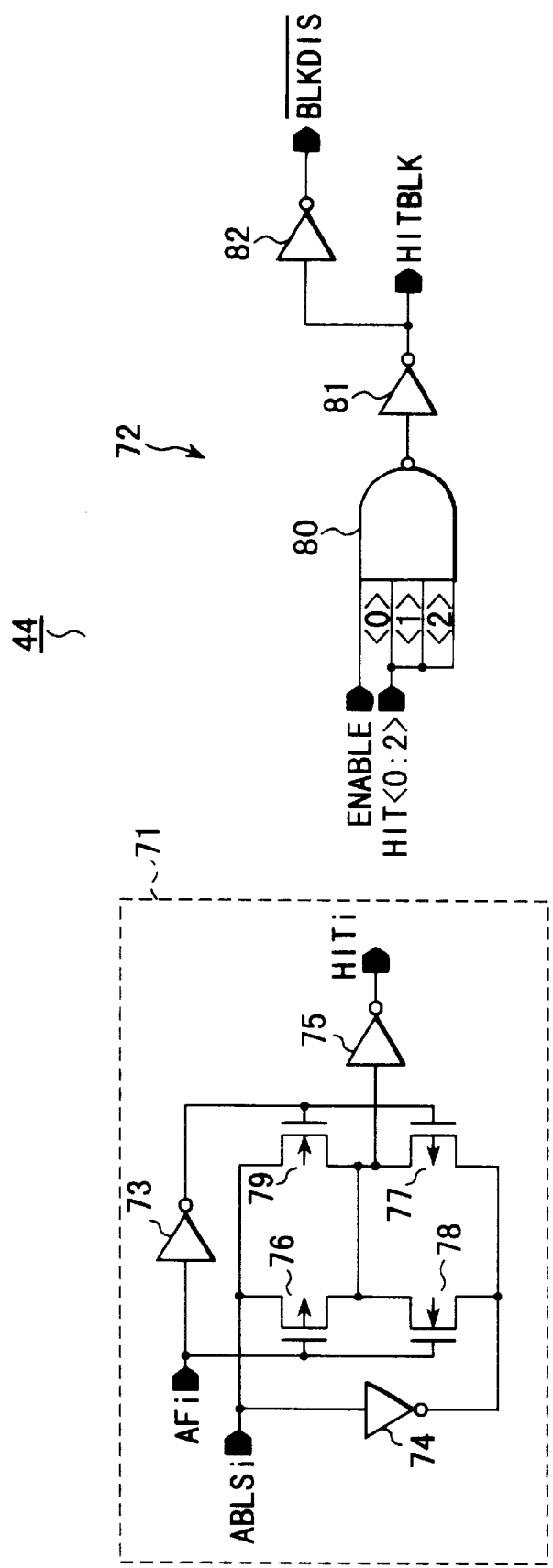
FIG. 8 is a circuit diagram showing an example of the construction of a block address comparing section in the circuit shown in FIG. 4.

FIG. 7 shows another example of the construction of the R/D address storing section in the circuit shown in FIG. 4. A case wherein the memory cell is used is explained in the circuit of FIG. 6, but in this example, a fuse F is used. The basic circuit construction is the same as the circuit of FIG. 6, portions which are the same as those of FIG. 6 are denoted by the same reference numerals and the detailed explanation therefor is omitted. With the above construction, if the fuse F is blown off by laser, a state equivalent to the state in which "1" is stored in the memory cell C1 of FIG. 6 (the signal AFi is set at the "1" level) is obtain, and if the fuse F is not blown by laser, a state equivalent to the state in which "0" is stored in the memory cell C1 (the signal AFi is set at the "0" level) is obtained. When the test signal BLKLOCK (opposite phase of the test signal /BLKLOCK) rises, the signal AFi is supplied as the signal FADi to the block address buffer 45 via the clocked inverter CINV3. Thus, substantially the same operation as in the circuit of FIG. 6 is attained according to whether the fuse F is cut off or not FIG. 8 is a circuit diagram showing an example of the construction of the block address comparing section 44 in the circuit shown in FIG. 4. The block address comparing section 44 includes R/D address detectors 71 of a number corresponding to the number of bits of the block address and a logic circuit section 72 supplied with output signals of the detectors 71. Each detector 71 includes inverters 73, 74, 75, PMOS transistors 76, 77 and NMOS transistors 78, 79. The signal AFi supplied from the R/D address storing section 43 is supplied to the input terminal of the inverter 73 and the gates of the transistors 76, 78. The output signal of the inverter 73 is supplied to the gates of the transistors 79, 77. The signal ABLSi output from the block address buffer 45 is supplied to the input terminal of the inverter 74 and one-side ends of the current paths of the transistors 76, 79. The output signal of the inverter 74 is supplied to one-side ends of the current paths of the transistors 78, 77. The other ends of the current paths of the transistors 76 to 79 are connected to the input terminal of the inverter 75 and a signal HITi is output from the inverter 75.

The logic circuit section 72 includes a NAND gate 80 and inverters 81, 82. A signal ENABLE which is set at the "H" level when the memory is activated (using block redundancy) is supplied to the first input terminal of the NAND gate 80. This signal ENABLE is generated by a circuit, which is equivalent to the circuit shown in FIG. 6 or FIG. 7. The second to the fourth input terminals thereof are supplied with signals HIT0, HIT1, HIT2 output from the 3-stage R/D address detector 71. An output signal of the NAND gate 80 is output as a signal HrTBLK via the inverter 81 and output as a signal /BLKDIS via the inverters 81, 82.

With the above construction, the output signal AFi of the R/D address storing section 43 and the output signal ABLSi of the block address buffer 45 are compared with each other by the R/D address detector 71, and if the result of comparison indicates "coincidence", the signal HITBLK is output from the logic circuit section 72. Thus, it becomes possible to set the block decoder 53 of the R/D block core 47-RD into the selected state, and at the same time, the signal /BLKDIS is output from the logic circuit section 72 and supplied to the block decoder 53 for normal selection in the block core containing the defect to forcedly set the block decoder 53 into the non-selected state. Therefore, the block core containing the defect can be replaced by the relieving R/D block core 47-RD.

Figure 9:
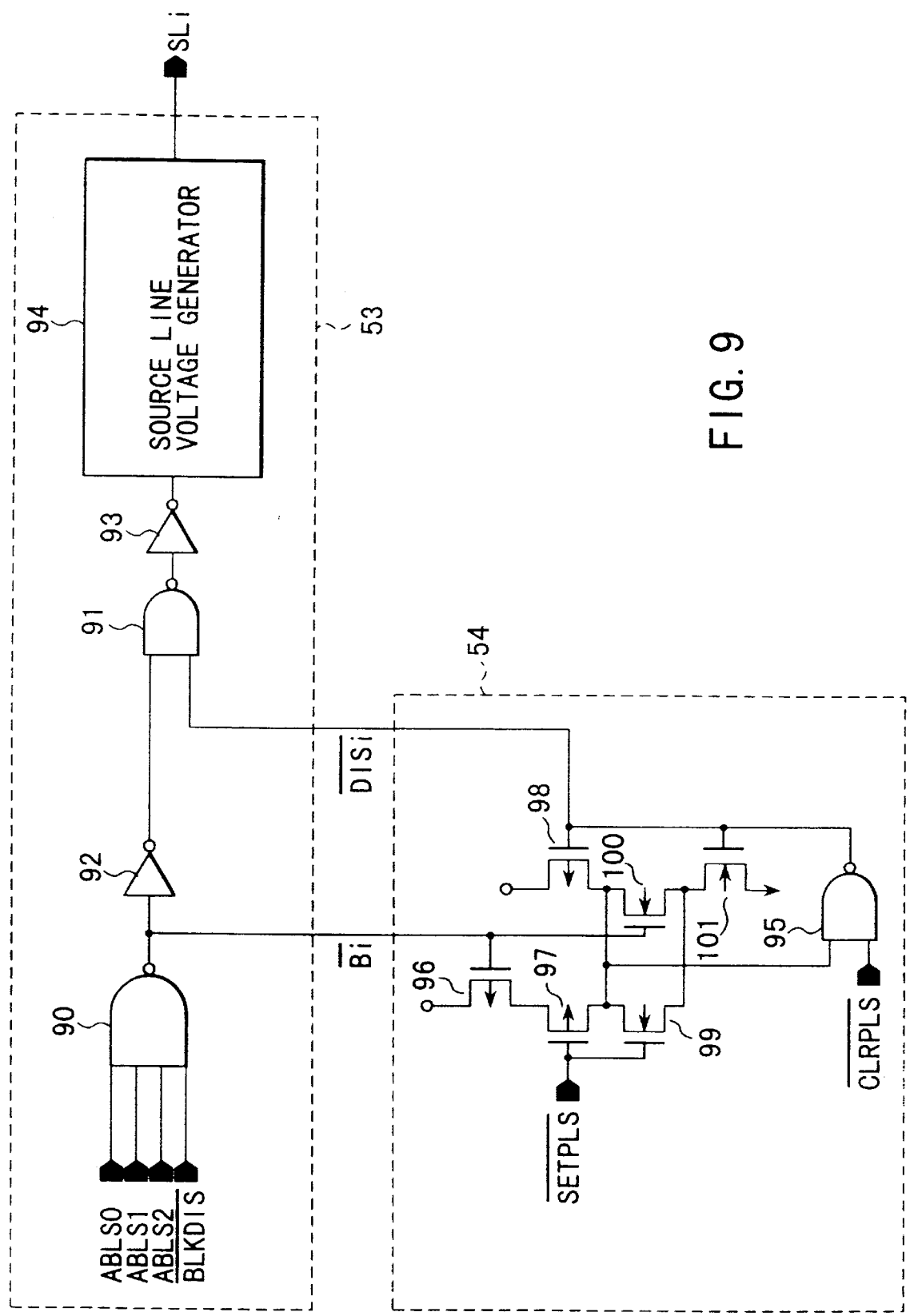
FIG. 9 is a circuit diagram showing an example of the construction of a block decoder and latch in the circuit shown in FIG. 4.

FIG. 9 is a circuit diagram showing an example of the construction of the block decoder 53 and disable latch 54 in the circuit shown in FIG. 4. The block decoder 53 includes NAND gates 90, 91, inverters 92, 93 and source line voltage generator 94 and the disable latch 54 includes a NAND gate 95, PMOS transistors 96 to 98 and NMOS transistors 99 to 101. Signals ABLS0 to ABLS2 output from the block address buffer 45 are supplied to the first to third input terminals of the NAND gate 90 and an output signal /BLKDIS of the inverter 82 in the block address comparing section 44 is supplied to the fourth input terminal thereof. An output signal (block selection signal) /Bi of the NAND gate 90 is supplied to the input terminal of the inverter 92 and to the gates of the transistors 96, 100. An output signal of the inverter 92 is supplied to one of the input terminals of the NAND gate 91 and an output signal (latch signal) /DISi of the NAND gate 95 is supplied to the other input terminal of the NAND gate 91. An output signal of the NAND gate 91 is supplied to the source line voltage generator 94 via the inverter 93 and a signal SLi is output from the source line voltage generator 94 and supplied to the memory cell array 51.

A signal /SETPLS output from the disable pulse generating section 46 is supplied to the gates of the transistors 97, 99 and a signal /CLRPLS is supplied to one of the input terminals of the NAND gate 95. The signal /SETPLS is a signal for setting the latch 54 and the signal /CLRPLS is a signal for resetting the same. The current paths of the transistors 96, 97, 99 are serially connected, one end of the series-connected current path is connected to the power supply and the other end thereof is connected to a connection node of the current paths of the transistors 100 and 101. The current paths of the transistors 98, 100, 101 are connected between the power supply and the ground node. The connection node of the current paths of the transistors 97 and 99 and the connection node of the current paths of the transistors 98 and 100 are connected to the other input terminal of the NAND gate 95 and an output signal of the NAND gate 95 is supplied to the gates of the transistors 98, 101.

With the above construction, the block decoder 53 controls the operation of the source line voltage generator 94 according to signals ABLSi (ABLS0, ABLS1, ABLS2) output from the block address buffer and a signal /BLKDIS output from the R/D address comparing section 44 so as to selectively apply the substrate potential SLi for each block core. Since the block decoder 53 in the defective block core is forcedly set into the non-selected state by the disable latch 54, application of the potential to the defective block can be prevented in the simultaneous erase operation for all of the blocks and a lowering in the potential can be prevented. As a result, the simultaneous erase operation for all of the blocks can be effected.

Figure 10:
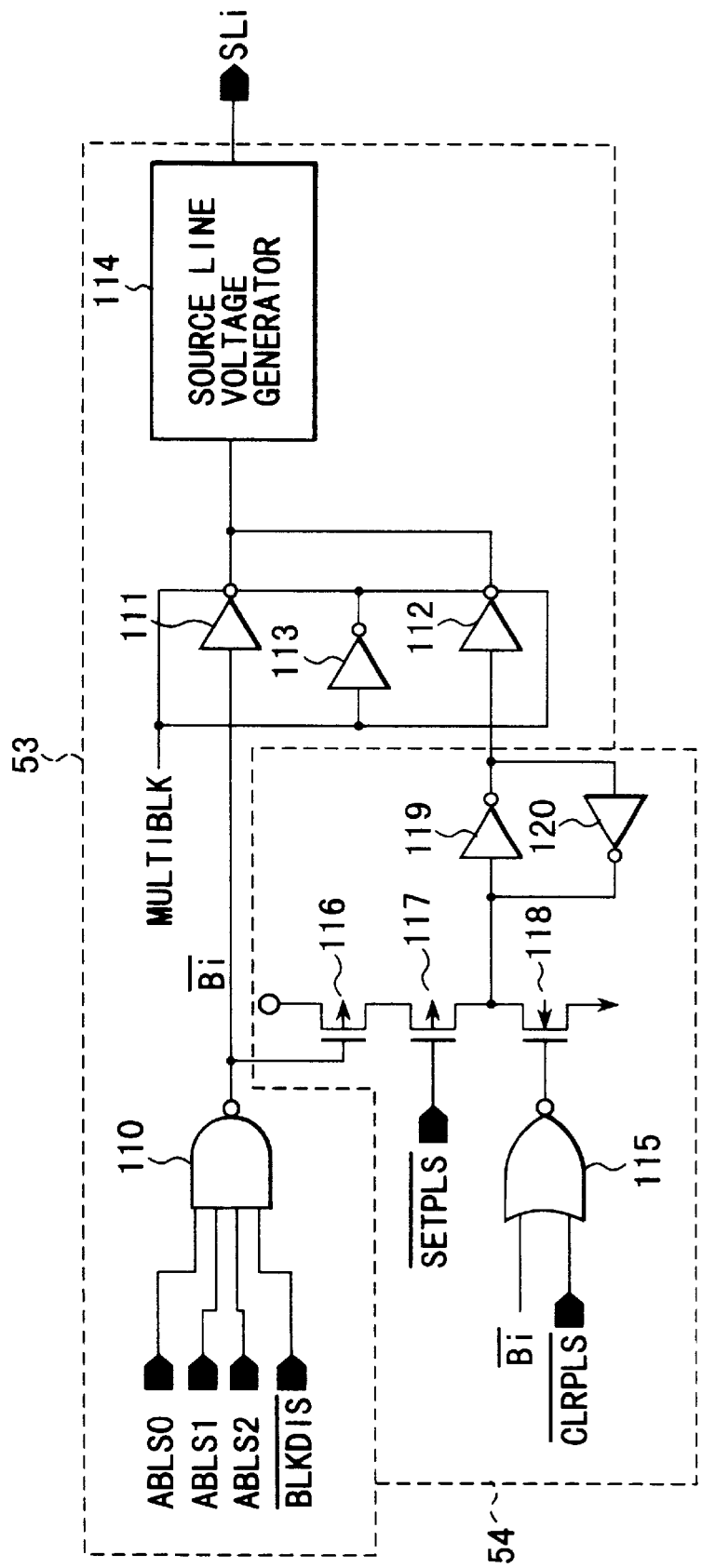
FIG. 10 is a circuit diagram showing another example of the construction of the block decoder and latch in the circuit shown in FIG. 4.

FIG. 10 is a circuit diagram showing another example of the construction of the block decoder 53 and disable latch 54 in the circuit shown in FIG. 4. The block decoder 53 includes a NAND gate 110, clocked inverters 111, 112, inverter 113 and source line voltage generator 114. The disable latch 54 includes a NOR gate 115, PMOS transistors 116, 117, NMOS transistor 118 and inverters 119, 120. Signals ABLS0 to ABLS2 output from the block address buffer 45 are supplied to the first to third input terminals of the NAND gate 110 and an output signal /BLKDIS of the inverter 82 in the block address comparing section 44 is supplied to the fourth input terminal thereof. An output signal (block selection signal) /Bi of the NAND gate 110 is supplied to the input terminal of the clocked inverter 111 and to the gate of the transistor 116. A signal MULTIBLK and a signal obtained by inverting the signal MULTIBLK by use of the inverter 113 are supplied to the clock input terminal of the clocked inverter 111 to control the operation thereof.

A signal /SETPLS output from the disable pulse generating section 46 is supplied to the gate of the transistor 117. A signal /CLRPLS is supplied to one of the input terminals of the NOR gate 115. An output signal /Bi of the NAND gate 110 is supplied to the other input terminal of the NOR gate 115 and an output signal of the NOR gate 115 is supplied to the gate of the transistor 118. The current paths of the transistors 116, 117, 118 are serially connected between the power supply and the ground node. A connection node of the current paths of the transistors 117 and 118 is connected to the input terminal of the inverter 119 and the output terminal of the inverter 120. The output terminal of the inverter 119 and the input terminal of the inverter 120 are connected to the input terminal of the clocked inverter 112. The signal MULTIBLK and a signal obtained by inverting the signal MULTIBLK by use of the inverter 113 are supplied to the clock input terminal of the clocked inverter 112 to control the operation thereof. Output signals of the clocked inverters 111, 112 are supplied to the source line voltage generator 114 which in turn supplies a signal SLi to the memory cell array 51.

In the above construction, the signal MULTIBLK is set at "0" level and the clocked inverters 111 and 112 are respectively activated and deactivated in order to ease the blocks one by one in formal manner. Then, the signals ABLSi (ABLS0, ABLS1, ABLS2) and the signal /BLKDIS are supplied to the block decoder 53 (i.e., NAND gate 110) provided in the block that has been selected. (The signals ABLSi have been output from the block address buffer 45, and the signal /BLKDIS has been output from the block address comparing section 44.) Thus, the signal (block-selecting signal) /Bi output from the NAND gate 110 provided in the block decoder 53 which has been selected by the signals ABLS0, ABLS1 and ABLS2 and in which no errors have made falls to low level. A high-level signal is thereby supplied to the source-line voltage generator 114 through the clocked inverter 111. Also, the source potential (10V) is applied to the common source line SLi.

In order to ease a plurality of blocks (or all blocks), the signal MULTIBLK is set at "1" level and the clocked inverters 111 and 112 are deactivated and activated, respectively. The signals ABLS0, ABSL1 and ABLS2 and the signal /BLKDIS are supplied to the block decoders 53 (i.e., NAND gates 110) of the block cores selected, respectively. Further, the disable latch 54 latches the block-selecting signal Bi been output from the NAND gate 110 in response to the pulse signals /CLRPLS and /SETPLS which have been output from the disable pulse generating section 46. In this way, the block-selecting signal /Bi is set in the disable latches 54 of the block cores that should be erased. Since the clocked inverter 112 remains activated in this case, the block-selecting signal /Bi set in each disable latch 54 is supplied to the source-line voltage generator 114 through the clocked inverter 112. The block decoder 53 provided in any block to be erased is selected. Then, the source potential (10V) is applied to the source line SLi that is common to all block cores that should be erased.

As in the circuit of FIG. 9, the block decoder 53 controls the source-line voltage generator 114 in accordance with signals ABLSi (ABLS0, ABLS1, ABLS2) and the signal /BLKDIS. (As mentioned above, the signals ABLSi have been output from the block address buffer 45, and the signal /BLKDIS has been output from the block address comparing section 44.) Therefore, the substrate potential SLi can be applied to each block core selected. The block decoder 53 provided in the block core to be erased is selected by the disable latch 54 and the signal MULTIBLK designating whether one block core or all block cores should be erased. The application of the potential to any defective block can be therefore prevented. Also, the potential can be prevented from decreasing. Hence, all blocks can be erased simultaneously.

Figure 11:
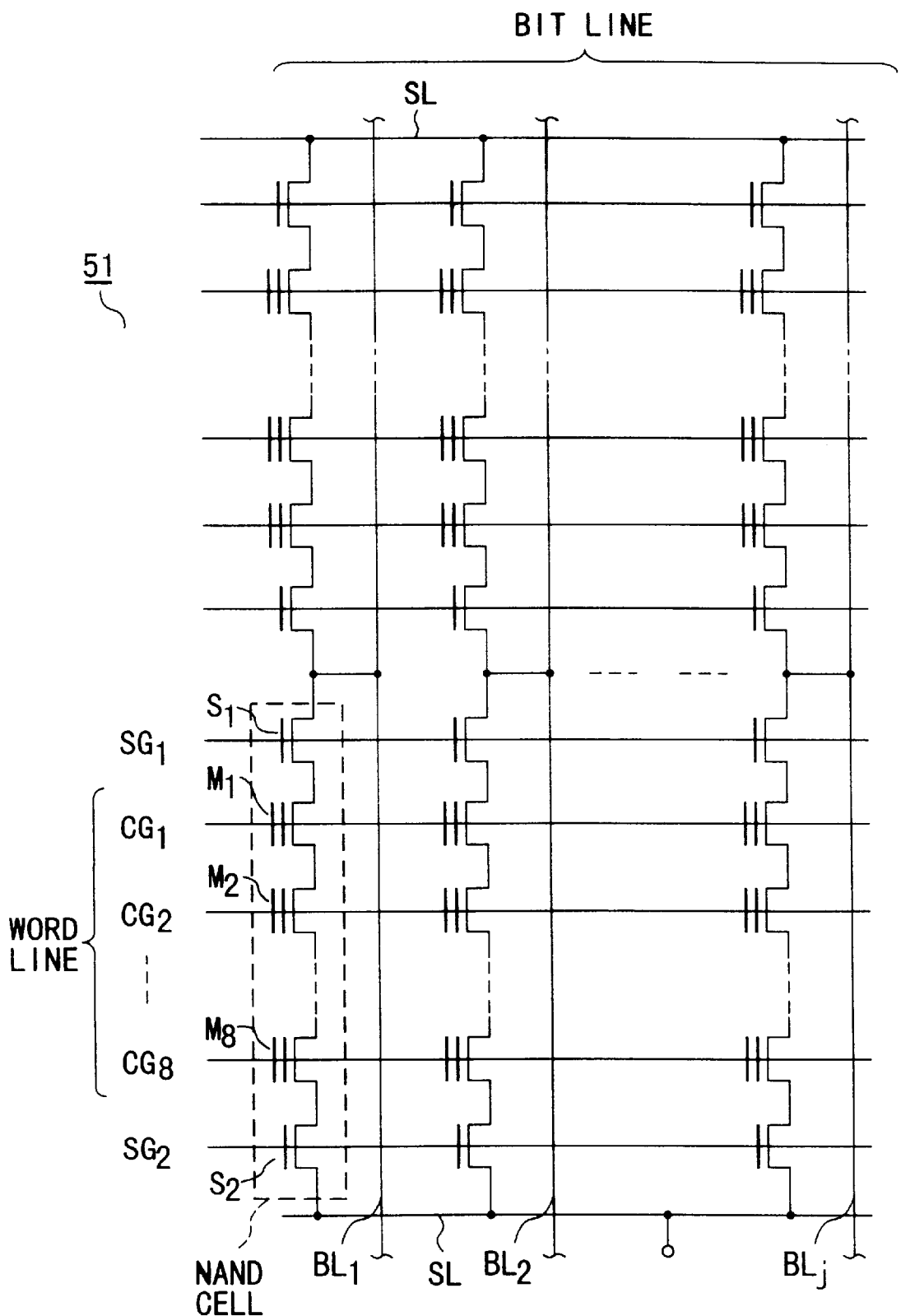
FIG. 11 is a circuit diagram showing an example of the construction of a memory cell array in the circuit shown in FIG. 4.

FIG. 11 shows an equivalent circuit showing an example of the construction of the memory cell array 51 in the circuit shown in FIG. 4. The memory cell array 51 has a NAND cell structure (for example, refer to IEEE JOURNAL OF SOLID-STATE CIRCUITS, Vol. 26 No. 4 April 1991 pp. 492–495). In this example, each NAND cell is constructed by serially connecting the current paths of eight memory cells $M_1$ to $M_8$ and respectively connecting first and second selection transistors $S_1$, $S_2$ to the drain side and source side of the series-connected current paths. The control gates of the memory cells $M_1$ to $M_8$ are formed to extend in the row direction to form control gate lines $CG_1, CG_2, \ldots, CG_8$. The control gate lines $CG_1, CG_2, \ldots, CG_8$ function as word lines. The gates of the selection transistors $S_1$, $S_2$ are also formed to extend in the row direction to form selection gate lines $SG_1$, $SG_2$. Bit lines $BL_1, BL_2, \ldots, BL_j$ are formed to extend in a direction which intersects the control gate lines $CG_1, CG_2, \ldots, CG_8$ and selection gate lines $SG_1$, $SG_2$. The drains of the selection transistors $S_1$ on the same column are connected to a corresponding one of the bit $BL_1, BL_2, \ldots, BL_j$. The sources of the selection transistors $S_2$ are commonly connected to a source line SL.

Figure 12:
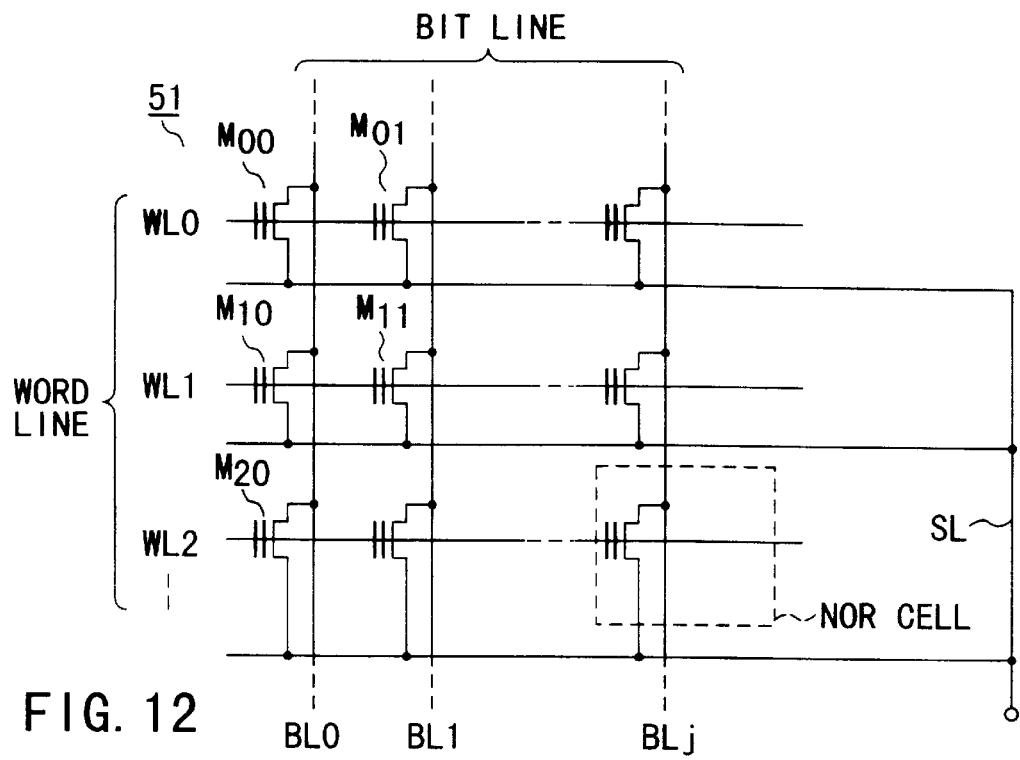
FIG. 12 is a circuit diagram showing another example of the construction of the memory cell array in the circuit shown in FIG. 4.

FIG. 12 shows an equivalent circuit showing another example of the construction of the memory cell array 51 in the circuit shown in FIG. 4. The memory cell array 51 has a NAND cell structure (for example, refer to U.S. Pat. No. 5,483,494). The drains of those of nonvolatile transistors $M_{00}$, $M_{01}$, ... which respectively constitute NOR cells and are arranged on the same column are connected to a corresponding one of bit lines $BL_1, BL_2, \ldots, BL_j$ and the sources of the nonvolatile transistors are commonly connected to a source line SL. The control gates of the nonvolatile transistors are formed to extend in the row direction to form word lines WL0, WL1, WL2, . . . .

Figure 13:
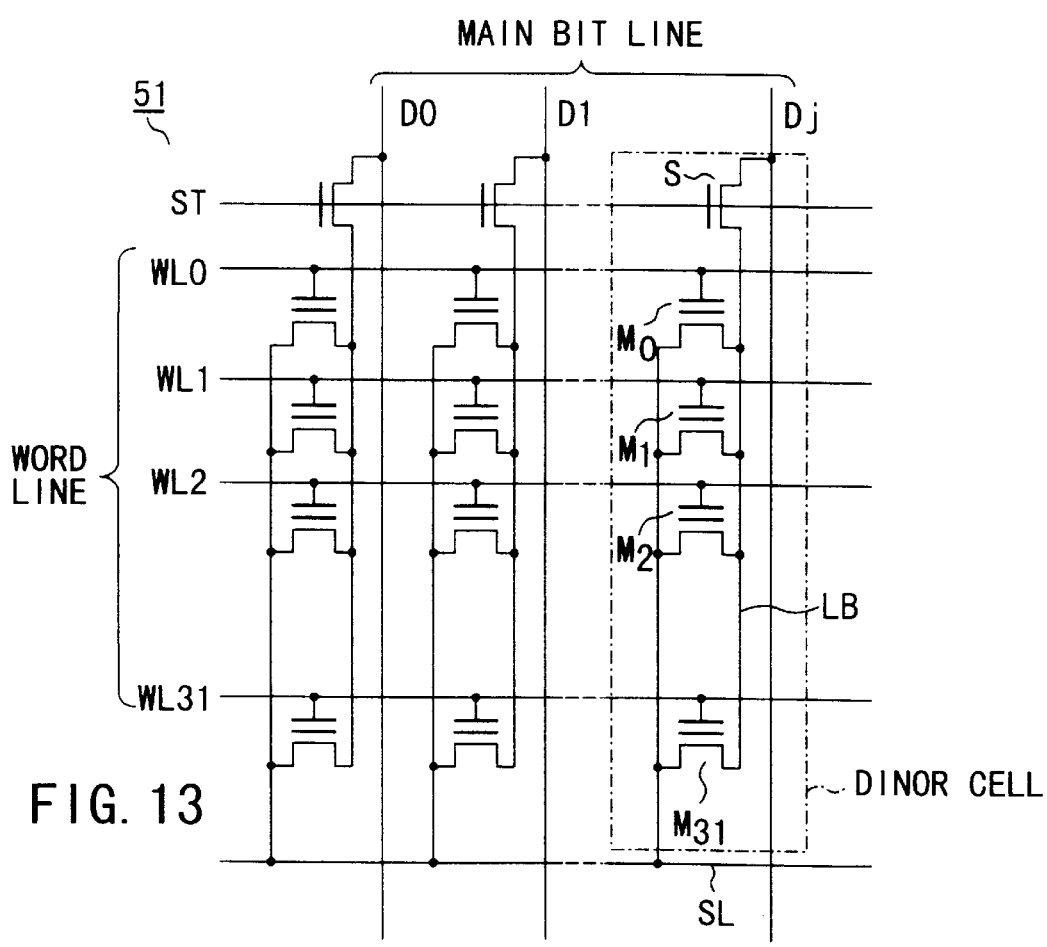
FIG. 13 is a circuit diagram showing still another example of the construction of the memory cell array in the circuit shown in FIG. 4.

FIG. 13 shows an equivalent circuit showing still another example of the construction of the memory cell array 51 in the circuit shown in FIG. 4. The memory cell array 51 has a DINOR cell structure (for example, refer to S. Kobayashi; ISSCC, Digest of Technical Papers, 1995, H. Onoda et al., IEDM tech. Digest, 1992, pp. 599 to 602). In this example, each DINOR cell is constructed by connecting the current paths of 32 memory cells $M_0$ to $M_{31}$ in parallel and connecting a selection transistor S to the drain sides of the memory cells. The control gates of the memory cells $M_0$ to $M_{31}$ are formed to extend in the row direction and function as word lines WL0, WL1, WL2, ... WL31. The gates of the selection transistors S are also formed to extend in the row direction to form a selection gate line ST. Bit lines contain main bit lines D0, D1, ..., Dj and local bit lines LB. The drains of the selection transistors S on the same column are connected to a corresponding one of the main bit lines D0, D1, ..., Dj and the sources of the selection transistors are respectively connected to the local bit lines LB. The drains of the memory cells $M_0$ to $M_{31}$ are connected to a corresponding one of the local bit lines LB and the sources thereof are connected to the source line SL.

Figure 14:
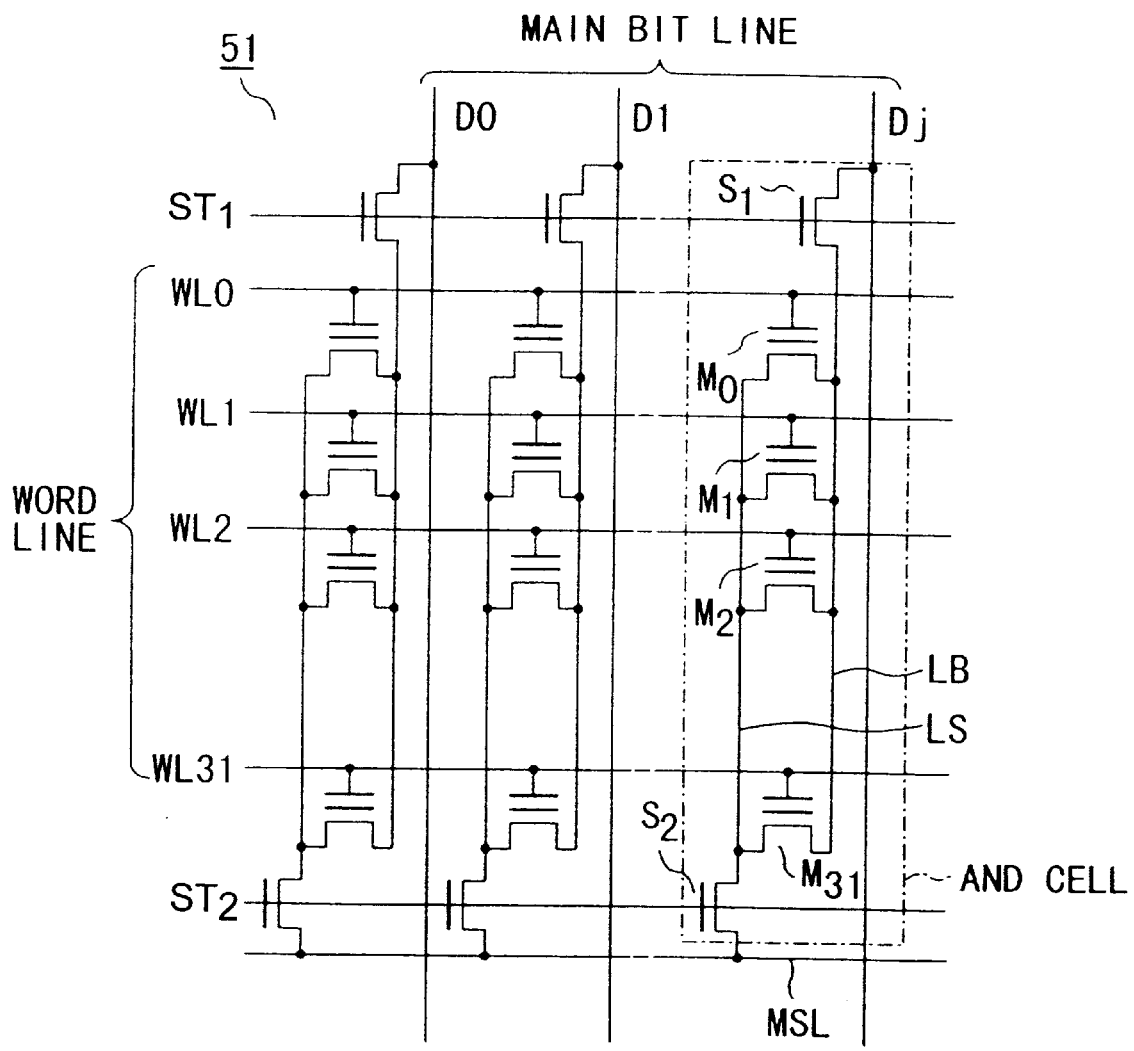
FIG. 14 is a circuit diagram showing another example of the construction of the memory cell array in the circuit shown FIG. 4.

FIG. 14 shows an equivalent circuit showing another example of the construction of the memory cell array 51 in the circuit shown in FIG. 4. The memory cell array 51 has an AND cell structure (for example, refer to A. Zozoe; ISSCC, Digest of Technical Papers, 1995, H. Kume et al., IEDM tech. Digest, 1992, pp. 991 to 993). In this example, each AND cell is constructed by connecting the current paths of 32 memory cells $M_0$ to $M_{31}$ in parallel, connecting a first selection transistor $S_1$ to the drain sides of the memory cells and connecting a second selection transistor $S_2$ to the source sides thereof. The control gates of the memory cells $M_0$ to $M_{31}$ are formed to extend in the row direction and function as word lines WL0, WL1, WL2, ..., WL31. The gates of the selection transistors $S_1$, $S_2$ are also formed to extend in the row direction to form first and second selection gate lines $ST_1$, $ST_2$. Bit lines contain main bit lines D0, D1, ..., Dj and local bit lines LB. Further, source lines contain a main source line MSL and local source lines LS. The drains of the selection transistors $S_1$ on the same column are connected to a corresponding one of the main bit lines D0, D1, ..., Dj and the source of the selection transistor is connected to the local bit line LB. The drains of the memory cells $M_0$ to $M_{31}$ are commonly connected to a corresponding one of the local bit lines LB and the sources thereof are connected to a corresponding one of the local source lines LS. The sources of the selection transistors $S_2$ are commonly connected to the main source line MSL and the drains thereof are respectively connected to the local source lines LS.

Figure 15:
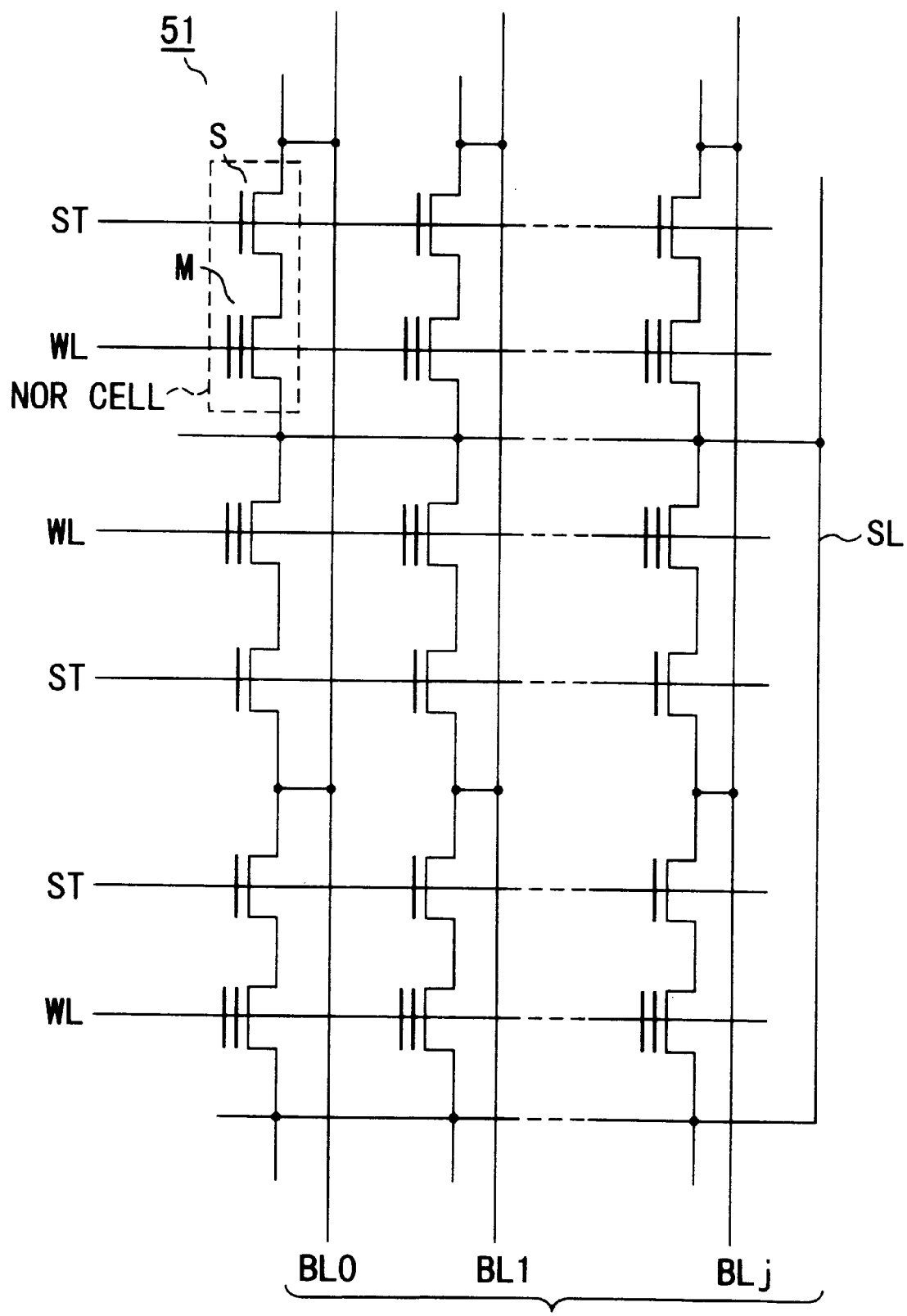
FIG. 15 is a circuit diagram showing still another example of the construction of the memory cell array in the circuit shown in FIG. 4.

FIG. 15 shows an equivalent circuit showing still another example of the construction of the memory cell array 51 in the circuit shown in FIG. 4. The memory cell array 51 has a NOR cell structure with selection transistors. Each NOR cell is constructed by a nonvolatile transistor M and selection transistor S. The drains of the selection transistors S on the same column are connected to a corresponding one of bit lines BL0, BL1, ..., BLj and the sources thereof are respectively connected to the nonvolatile transistors M. The sources of the nonvolatile transistors M are commonly connected to a source line SL. The control gates of the nonvolatile transistors M are formed to extend in the row direction to form word lines WL. The gates of the selection transistors S are also formed to extend in the row direction to form selection gate lines ST.

This invention can be generally applied to an EEPROM which electrically erases/reprograms data and can be applied to any type of flash memory such as a Virtual Ground Array type (refer to Lee. et al; Symposium on VLSI Circuits, Digest of Technical Papers, 1994), for example.

As described above, according to this invention, in a semiconductor memory device in which electrons in the floating gate are withdrawn into the substrate (P-well region) at the erase time of the memory cell, even if a defective memory cell is detected, the defective memory cell can be replaced without fail.

Further, in a case wherein all of the blocks in the semiconductor memory device are simultaneously subjected to the erase operation, the voltage drop in the defective portion can be suppressed by preventing a potential from being applied to the defective block core and the erase operation for normal block cores will not be obstructed.

By using memory cells which have the same structure as the memory cells of the main body as memory elements of fail addresses and lowering the threshold voltage of the memory cell at the erase time to a GND level or less, the readout operation can be effected with the control gate voltage set at the power supply voltage, it is not necessary to control the control gate potential and the operation margin of the low-voltage operated device can be made large.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
    a plurality of first memory blocks each having memory cells arranged in a matrix form;
    a first decoder for selectively activating said first memory blocks;
    at least one second memory block of substantially the same construction as said first memory block;
    a second decoder for selecting said second memory block;
    a block address buffer for outputting block address information;
    a defective block address storing section having a memory element and a latch circuit for holding address information stored in said memory element, for storing a defective block address, wherein a readout operation of said defective block address storing section is effected at the turn-ON time of a power supply and the information stored in said memory element is latched into said latch circuit; and
    a defective block address comparing section for comparing the defective block address latched in said latch circuit of said defective block address storing section with a block address input from said block address buffer;
    wherein said first decoder which selects the first memory block in which a defective cell occurs is set into the non-selected state and said second decoder is set into the selected state when coincidence of the compared addresses is detected in said defective block address comparing section.

2. The semiconductor memory device according to claim 1, wherein the defective block address stored in said defective block address storing section is input to said block address buffer at the time of simultaneous erase for a plurality of memory blocks and said first decoder latches first data into a corresponding one of first latch circuits which are respectively provided in said memory blocks to inhibit application of an erase potential to the memory cells in one of said memory blocks in which the first data is latched into the first latch circuit.

3. The semiconductor memory device according to claim 1, wherein said memory element of said defective block address storing section includes a transistor having substantially the same structure as the memory cells of said first and second memory cell arrays.

4. The semiconductor memory device according to claim 3, wherein the threshold voltage of the transistor is lowered to a level which is not higher than a ground level at the erase time of the memory element and programmed to a level higher than a power supply potential at the programming time and the control gate potential is set at the power supply potential at the readout time.

5. The semiconductor memory device according to claim 1, wherein said memory element of said defective block address storing section includes fuse elements.

6. The semiconductor memory device according to claim 5, wherein the defective block address is stored according to whether a fuse element is blown.

7. A semiconductor memory device in which electrons in a floating gate are withdrawn into a well region at the erase time of a memory cell, comprising:
    a plurality of block cores each including a memory cell array having memory cells arranged in a matrix form, a row decoder for selecting a row of the memory cells of the memory cell array, a block decoder for selecting a block, a latch for holding the selected state of the memory cell array, and a column selection gate for selecting a column of the memory cells of the memory cell array;
    at least one redundancy block core of substantially the same construction as said plurality of block cores;
    a row address buffer supplied with a row address signal, for supplying an internal row address signal to the row decoders in said plurality of block cores and redundancy block core;
    a column address buffer supplied with a column address signal;
    a column decoder for decoding an internal column address signal output from said column address buffer to select column selection gates of said plurality of block cores and redundancy block core;
    a block address buffer supplied with a block address, for outputting a block selection signal to the block decoders of said plurality of block cores;
    a redundancy address storing section for storing an address of the block core in which a defect occurs;
    an address comparing section for comparing the address of the block core stored in said address storing section with the block selection signal output from said block address buffer;
    a pulse generating section for outputting a pulse signal;
    a sense amplifier for amplifying data read out from the selected memory cell; and
    an input/output buffer for transferring data with respect to said sense amplifier;
    wherein an address of the block core is stored in said address storing section when a defect occurs in the memory cell array of the block core, a disable signal is output from said address comparing section when coincidence is detected by said address comparing section, and the block decoder in the block core in which the defect occurs is forcedly set into the non-selected state and said block decoder in said redundancy block core is set into the selected state to replace the block core in which the defect occurs by said redundancy block core.

8. The semiconductor memory device according to claim 7, wherein a fail address is input from said address storing section to said block address buffer when a plurality of blocks are simultaneously subjected to the erase operation, a block selection signal is supplied to the latch of the block core in which the defect occurs to latch a disable signal in response to a pulse signal output from said pulse generating section, thereby forcedly setting the block decoder in the block core in which the defect occurs into a non-selected state.

9. The semiconductor memory device according to claim 7, wherein block address signals of the blocks to be erased are sequentially input to the block decoder in order to erase the blocks at the same time, and a block selection signal is latched in the latch in response to the pulse signal output from the pulse generating section, in order to select the block decoder provided in the block core which is to be erased.

10. The semiconductor memory device according to claim 7, wherein said plurality of block cores are formed in wells independently formed.

11. A semiconductor memory device comprising:
   a plurality of first block cores each including a memory cell array having memory cells arranged in a matrix form, a row decoder for selecting a row of the memory cells of the memory cell array, a block decoder for selecting a block, a latch for holding the selected state of the memory cell array, and a column selection gate for selecting a column of the memory cells of the memory cell array;
   at least one second block core of substantially the same construction as said plurality of first block cores;
   a row address buffer supplied with a row address signal, for supplying an internal row address signal to each row decoder in said plurality of first block cores and said at least one second block core;
   a column address buffer supplied with a column address signal;
   a column decoder for decoding an internal column address signal output from said column address buffer to select column selection gates of said plurality of first block cores and said at least one second block core;
   a block address buffer supplied with a block address, for outputting a block selection signal to each block decoder of said plurality of first block cores;
   a redundancy address storing section for storing an address of a first block core in which a defect occurs;
   an address comparing section for comparing the address of the first block core stored in said redundancy address storing section with a block selection signal output from said block address buffer;
   a disable pulse generating section for outputting a pulse signal to control an operation of a disable latch provided in said plurality of first block cores and said at least one second block core;
   a sense amplifier for amplifying data read out from a selected memory cell; and
   an input/output buffer for transferring data with respect to said sense amplifier;
   wherein, when said plurality of blocks are simultaneously subjected to an erase operation, a defective address is input into said block address buffer from said redundancy address storing section, a block selection signal is supplied to said disable latch of the block core in which the defect occurs, and a disable signal is latched in response to the pulse signal output from said disable pulse generating section, for forcedly setting the block decoder of the block core in which the defect occurs into a non-selected state.

12. The semiconductor memory device according to claim 11, wherein electrons in a floating gate are withdrawn into a well region at erase time of a memory cell.

13. The semiconductor memory device according to claim 11, wherein an address of the first block core is stored in said redundancy address storing section when a defect occurs in the memory cell array of the first block core, the disable signal is output from said address comparing section when coincidence is detected by said address comparing section, and the block decoder in the first block core in which the defect occurs is forcedly set into the non-selected state and the block decoder in a second block core is set into the selected state to replace the first block core in which the defect occurs with the second block core.

14. The semiconductor memory device according to claim 11, wherein the disable signal output from said address comparing section is supplied only to each of the block decoders of said plurality of first block cores.

15. The semiconductor memory device according to claim 11, wherein the block decoder includes a voltage generator for generating a source potential and a substrate potential of the memory cells at erase time.

16. The semiconductor memory device according to claim 15, wherein the voltage generator is a source line voltage generator for applying a source potential to a common source line.

17. The semiconductor memory device according to claim 16, wherein the block decoder further comprises a logic circuit supplied with the block selection signal, the disable signal, and an output signal of the disable latch, for performing a logic operation and supplying a result of the logic operation to the source line voltage generator.

18. The semiconductor memory device according to claim 11, wherein the disable latch is supplied with the block selection signal and latches the disable signal in response to the pulse signal output from said disable pulse generating section.

19. A semiconductor memory device comprising:
   a plurality of first block cores each including a memory cell array having memory cells arranged in a matrix form, a row decoder for selecting a row of the memory cells of the memory cell array, a block decoder for sealing a block, a latch for holding the selected state of the memory cell array, and a column selection gate for selecting a column of the memory cells of the memory cell array;
   at least one second block core of substantially the same construction as said plurality of first block cores;
   a row address buffer supplied with a row address signal, for supplying an internal row address signal to each row decoder in said plurality of first block cores and said at least one second block core;
   a column decoder for decoding an internal column address signal output from said column address buffer to select a column selection gate of said plurality of first block cores and said at least one second block core;
   a block address buffer supplied with a block address, for outputting a block selection signal to each block decoder of said plurality of first block cores;
   a redundancy address storing section for storing an address of a first block core in which a defect occurs;
   an address comparing section for comparing the address of the first block core stored in said redundancy address storing section with a block selection signal output from said block address buffer;
   a disable pulse generating section for outputting a pulse signal to control an operation of a disable latch provided in said plurality of first block cores and said at least one second block core;
   a sense amplifier for amplifying data read out from a selected memory cell; and an input/output buffer for transferring data with respect to said sense amplifier;

wherein, when said plurality of blocks are simultaneously subjected to an erase operation, a block address of a block to be erased is sequentially input into said block decoder, and a block selection signal is latched in said disable latch in response to the pulse signal output from said disable pulse generating section, for forcedly setting the block decoders of the block cores to be erased into a selected state.

* * * * *

UNITED STATES PATENT AND TRADEMARK OFFICE
CERTIFICATE OF CORRECTION

PATENT NO.    : 6,327,180 B2
DATED         : December 4, 2001
INVENTOR(S)   : Tadayuki Taura et al.

It is certified that error appears in the above-identified patent and that said Letters Patent is hereby corrected as shown below:

<u>Column 18,</u>
Line 38, "sealing" has been replaced with -- selecting --
Line 48, insert -- a column address buffer supplied with a column address signal; --

Signed and Sealed this

Eighteenth Day of June, 2002

*Attest:*

JAMES E. ROGAN
*Attesting Officer*   *Director of the United States Patent and Trademark Office*